US011953375B2

(12) United States Patent
Yamaji

(10) Patent No.: US 11,953,375 B2
(45) Date of Patent: Apr. 9, 2024

(54) LIGHT RECEIVING MODULE COMPRISING STEM AND BLOCK ON AN UPPER SURFACE OF THE STEM

(71) Applicant: Mitsubishi Electric Corporation, Tokyo (JP)

(72) Inventor: Kazuki Yamaji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/760,163

(22) PCT Filed: Jul. 6, 2020

(86) PCT No.: PCT/JP2020/026367
§ 371 (c)(1),
(2) Date: Aug. 4, 2022

(87) PCT Pub. No.: WO2022/009259
PCT Pub. Date: Jan. 13, 2022

(65) Prior Publication Data
US 2023/0051355 A1 Feb. 16, 2023

(51) Int. Cl.
*G01J 1/44* (2006.01)
*G01J 1/46* (2006.01)
(Continued)

(52) U.S. Cl.
CPC ............... *G01J 1/46* (2013.01); *H01L 23/66* (2013.01); *H01L 31/02005* (2013.01);
(Continued)

(58) Field of Classification Search
CPC .......... G02B 6/42; H01L 31/02; H01L 23/64; H01L 23/66; H01L 31/107; H01L 23/60;
(Continued)

(56) References Cited

U.S. PATENT DOCUMENTS 5,652,425 A * 7/1997 Sawada ................ H03F 3/082
367/901
8,059,973 B2 * 11/2011 Douma ................ G02B 6/4246
250/214 R
(Continued)

FOREIGN PATENT DOCUMENTS

JP S55-013927 A 1/1980
JP H03-150891 A 6/1991
(Continued)

OTHER PUBLICATIONS

International Search Report issued in PCT/JP2020/026367; dated Sep. 8, 2020.
(Continued)

*Primary Examiner* — Que Tan Le
(74) *Attorney, Agent, or Firm* — Studebaker & Brackett PC

(57) ABSTRACT

A plurality of lead pins (2a-d) penetrates through a stem (1) having a circular shape and includes a signal lead pin (2a,2b). A block (4) is provided on an upper surface of the stem. A waveguide light receiving device (9) is provided on a side surface of the block. An amplifier (6) is provided on the side surface of the block and amplifies an electric signal output from the waveguide light receiving device. A first relay substrate is provided on the upper surface of the stem and arranged between the block and the signal lead pin. A first transmission line (12a,12b) is provided on the first relay substrate. A first wire (10f,10g) connects one end of the first transmission line and an output terminal of the amplifier. A second wire (10h,10i) connects the other end of the first transmission line (12a,12b) and the signal lead pin.

7 Claims, 6 Drawing Sheets

(51) Int. Cl.
  *H01L 23/66* (2006.01)
  *H01L 31/02* (2006.01)
  *H01L 31/0203* (2014.01)
  *H01L 31/0232* (2014.01)
  *H01P 3/08* (2006.01)

(52) U.S. Cl.
  CPC .... *H01L 31/02019* (2013.01); *H01L 31/0203* (2013.01); *H01L 31/02325* (2013.01); *H01P 3/081* (2013.01); *H01L 2223/6611* (2013.01); *H01L 2223/6627* (2013.01)

(58) Field of Classification Search
  CPC ...... H01P 3/00; H01P 5/00; H01P 3/08; G01J 1/44; G01J 1/46; G01J 1/02
  USPC .............................................. 250/239, 214 R
  See application file for complete search history.

(56) References Cited

U.S. PATENT DOCUMENTS

| | | |
|---|---|---|
| 2003/0138008 A1 | 7/2003 | Riaziat et al. |
| 2003/0235376 A1 | 12/2003 | Kuhara et al. |
| 2004/0091217 A1 | 5/2004 | Nawae et al. |
| 2012/0045161 A1 | 2/2012 | Okada |
| 2012/0267738 A1 | 10/2012 | Kuwahara et al. |

FOREIGN PATENT DOCUMENTS

| | | |
|---|---|---|
| JP | 2000-028872 A | 1/2000 |
| JP | 2003-318418 A | 11/2003 |
| JP | 2004-088046 A | 3/2004 |
| JP | 2004-184663 A | 7/2004 |
| JP | 2005-159036 A | 6/2005 |
| JP | 2005-516404 A | 6/2005 |
| JP | 2007-305731 A | 11/2007 |
| JP | 2012-114342 A | 6/2012 |
| JP | 2012-227486 A | 11/2012 |
| WO | 2010/140473 A1 | 12/2010 |

OTHER PUBLICATIONS

An Office Action; mailed by the Japanese Patent Office dated Jan. 5, 2021, which corresponds to Japanese Patent Application No. 2020-560417, with Partial English language Machine Translation.

\* cited by examiner

LIGHT RECEIVING MODULE COMPRISING STEM AND BLOCK ON AN UPPER SURFACE OF THE STEM

FIELD

The present disclosure relates to a light receiving module.

BACKGROUND

A waveguide light receiving device is an end-face-incident light receiving device that can achieve both a high sensitivity and a wide band. A light receiving module in which such an end-face-incident light receiving device is mounted on a small-sized inexpensive CAN package has been proposed (refer to Patent Literature 1, for example).

CITATION LIST

Patent Literature

[Patent Literature 1] JP 2004-88046 A

SUMMARY

Technical Problem

In a conventional module, the length of a wire through which an amplifier provided on a side surface of a block on a stem is connected to a signal lead pin is long, and accordingly, the inductance of the wire increases and the band degrades, which has been a problem.

In addition, a plurality of lead pins other than the signal lead pin penetrate through the stem. The freedom of arrangement of the plurality of lead pins decreases when the signal lead pin is positioned closer to the block to shorten the length of the wire. Thus, the plurality of lead pins cannot be arranged such that the radius of the stem having a circular shape decreases, and accordingly, the size of the module increases, which has been a problem.

The present disclosure is intended to solve the problems as described above and obtain a light receiving module that can prevent band degradation and achieve size reduction.

Solution to Problem

A light receiving module according to the present disclosure includes: a stem having a circular shape; a plurality of lead pins penetrating through the stem and including a signal lead pin; a block provided on an upper surface of the stem; a waveguide light receiving device provided on a side surface of the block; an amplifier provided on the side surface of the block and amplifying an electric signal output from the waveguide light receiving device; a first relay substrate provided on the upper surface of the stem and arranged between the block and the signal lead pin; a first transmission line provided on the first relay substrate; a first wire connecting one end of the first transmission line and an output terminal of the amplifier; and a second wire connecting the other end of the first transmission line and the signal lead pin.

Advantageous Effects of Invention

In the present disclosure, the relay substrate is provided on the upper surface of the stem. Thus, the freedom of arrangement of the plurality of lead pins is increased and the plurality of lead pins can be arranged such that the radius of the stem having a circular shape decreases. In addition, the use of the relay substrate shortens the length of the wire between the amplifier and the signal lead pin and decreases the inductance of the wire. As a result, the light receiving module that can prevent band degradation and achieve size reduction is obtained.

DESCRIPTION OF EMBODIMENTS

A light receiving module according to the embodiments of the present disclosure will be described with reference to the drawings. The same components will be denoted by the same symbols, and the repeated description thereof may be omitted.

Embodiment 1

Figure 1:
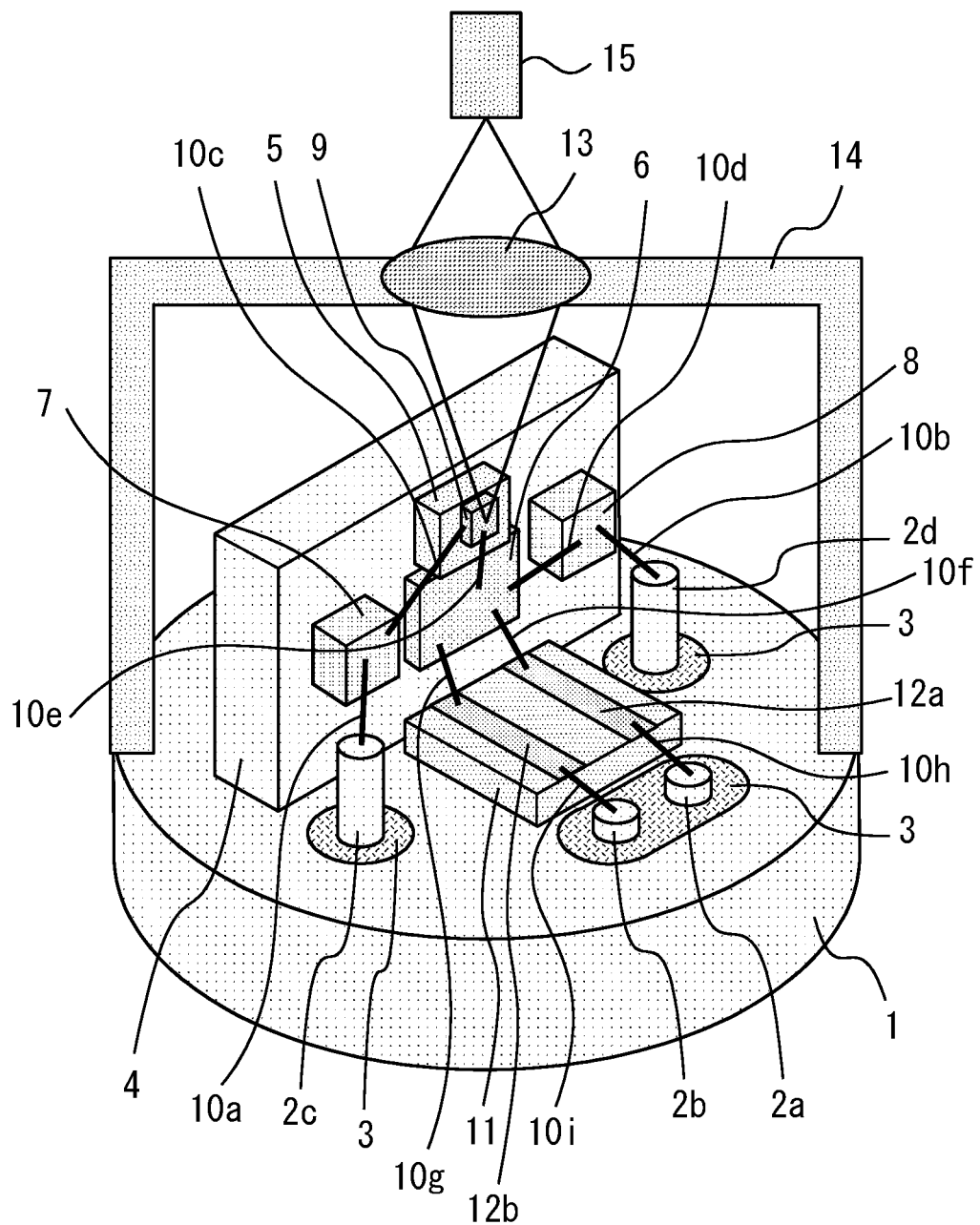
FIG. 1 is a perspective view illustrating a light receiving module according to Embodiment 1.
Figure 2:
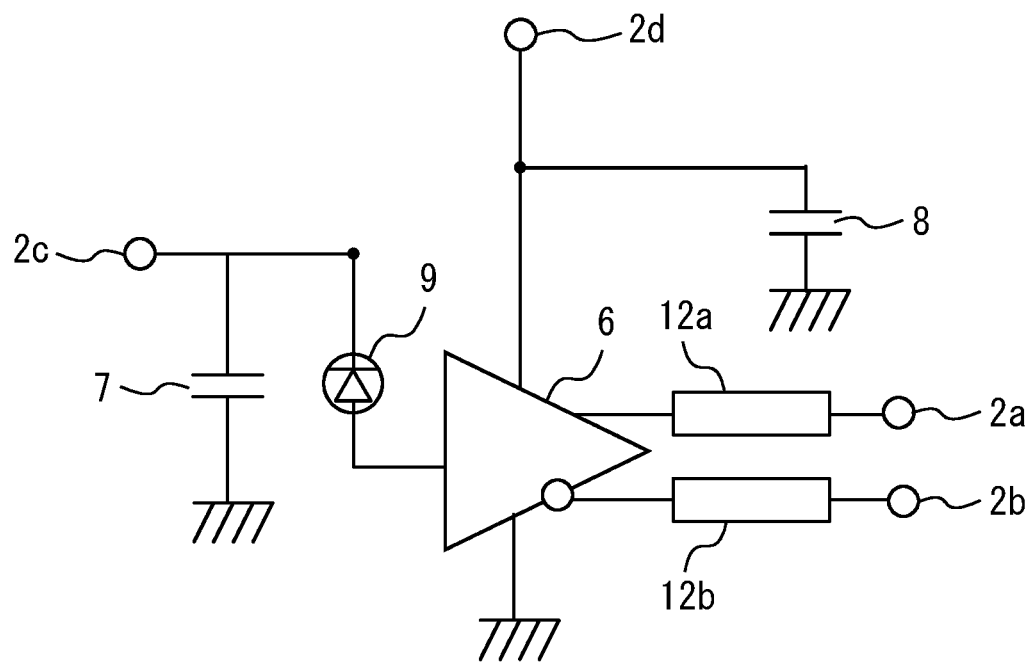
FIG. 2 is a circuit diagram of the light receiving module according to Embodiment 1.

FIG. 1 is a perspective view illustrating a light receiving module according to Embodiment 1. FIG. 2 is a circuit diagram of the light receiving module according to Embodiment 1. A stem 1 is an electric conductor having a circular shape and the ground potential.

Signal lead pins 2a and 2b and power-source lead pins 2c and 2d penetrate through the stem 1. An insulating seal glass 3 is provided between the stem 1 and each of the lead pins 2a to 2d, and accordingly, they are insulated from each other. Leading ends of the lead pins 2a to 2d protrude from an upper surface of the stem 1.

A block 4 is provided on the upper surface of the stem 1, and the upper surface of the stem 1 and a lower surface of the block 4 are joined. In the present embodiment, the block 4 is an electric conductor connected to the stem 1 and having the ground potential. A sub mount 5, a transimpedance amplifier (TIA) 6, and capacitors 7 and 8 are provided on one side surface of the block 4. A waveguide light receiving device 9 is mounted on the sub mount 5. The waveguide light receiving device 9 is a photo diode (PD) or an avalanche photo diode (APD). Since a plurality of components are provided on the one side surface of the block 4 in this manner, the transverse width of the block 4 is larger than the interval between the lead pins 2c and 2d.

A lower-surface electrode of the capacitors 7 and 8 is connected to the block 4. Upper-surface electrodes of the capacitors 7 and 8 are connected to the lead pins 2c and 2d, respectively, through wires 10a and 10b. The upper-surface electrode of the capacitor 7 is connected to a cathode electrode of the waveguide light receiving device 9 through the wire 10c. The upper-surface electrode of the capacitor 8 is connected to a power source terminal of the TIA 6 through a wire 10d. An anode electrode of the waveguide light receiving device 9 is connected to an input terminal of the TIA 6 through a wire 10e.

A relay substrate 11 made of an insulator is provided on the upper surface of the stem 1 and arranged between the block 4 and each of the lead pins 2a and 2b. Transmission lines 12a and 12b are provided on the relay substrate 11. One end of the transmission line 12a is connected to a normal-phase output terminal of the TIA 6 through a wire 10f One end of the transmission line 12b is connected to a reverse-phase output terminal of the TIA 6 through a wire 10g. The other ends of the transmission lines 12a and 12b are connected to the lead pins 2a and 2b, respectively, through wires 10h and 10i. The wires 10a to 10i are, for example, Au wires.

A cap 14 provided with a lens 13 is fixed to the upper surface of the stem 1 to cover the waveguide light receiving device 9 and the like. The waveguide light receiving device 9 is arranged such that an end face thereof is substantially orthogonal to the optical axis of incident light from an optical fiber 15. The incident light from the optical fiber 15 is condensed through the lens 13 and incident on the end face of the waveguide light receiving device 9. Thus, the waveguide light receiving device 9 is arranged at a central part of the stem 1 having a circular shape.

The waveguide light receiving device 9 converts an incident optical signal into an electric signal. The TIA 6 is a differential amplifier configured to amplify the electric signal output from the waveguide light receiving device 9. A differential output signal from the TIA 6 is output to the outside of the module through the transmission lines 12a and 12b and the lead pins 2a and 2b. The lead pin 2c is provided to supply electric power to the waveguide light receiving device 9. The lead pin 2d is provided to supply electric power to the TIA 6.

Figure 3:
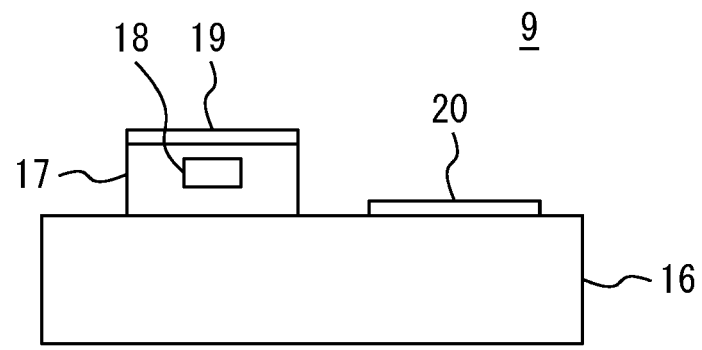
FIG. 3 is a cross-sectional view illustrating the waveguide light receiving device.

FIG. 3 is a cross-sectional view illustrating the waveguide light receiving device. A semiconductor laminated structure 17 is provided on a semiconductor substrate 16. A waveguide 18 is included in the semiconductor laminated structure 17. An anode electrode 19 is provided on the semiconductor laminated structure 17. A cathode electrode 20 is provided on the semiconductor substrate 16. The waveguide 18 is a light receiving unit of the waveguide light receiving device 9.

Figure 4:
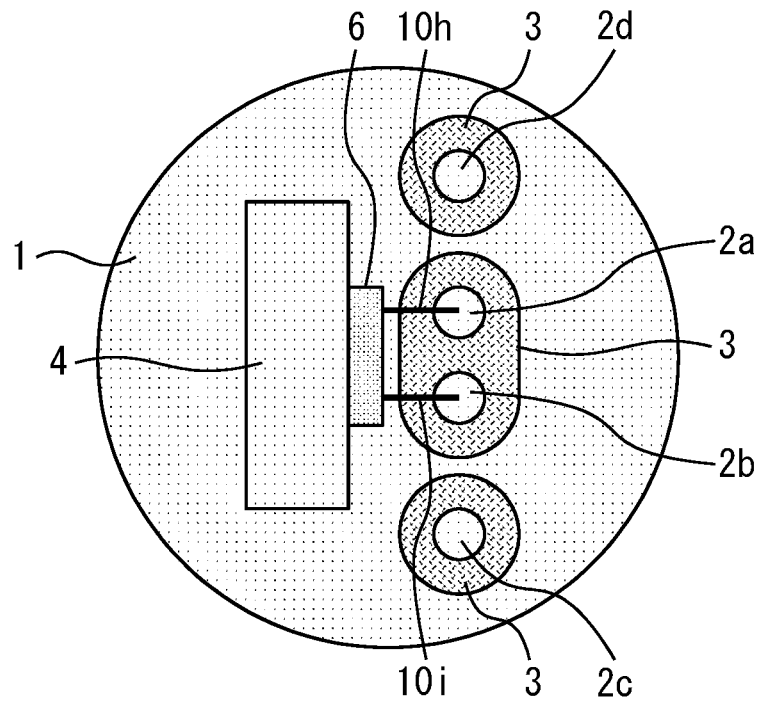
FIG. 4 is a top view illustrating a light receiving module according to the comparative example.

Effects of the present embodiment will be described below in comparison with a comparative example. FIG. 4 is a top view illustrating a light receiving module according to the comparative example. No relay substrate 11 is provided in the comparative example. Accordingly, the normal-phase and reverse-phase output terminals of the TIA 6 are directly connected to the lead pins 2a and 2b, respectively, through the wires 10h and 10i. The plurality of lead pins 2a to 2d are arranged in line when the signal lead pins 2a and 2b are positioned closer to the block 4 to shorten the lengths of the wires 10h and 10i. Each of the signal lead pins 2a and 2b and the corresponding one of the power-source lead pins 2c and 2d need to be separated from each other to some extent. Accordingly, the radius of the stem 1 having a circular shape increases.

Figure 5:
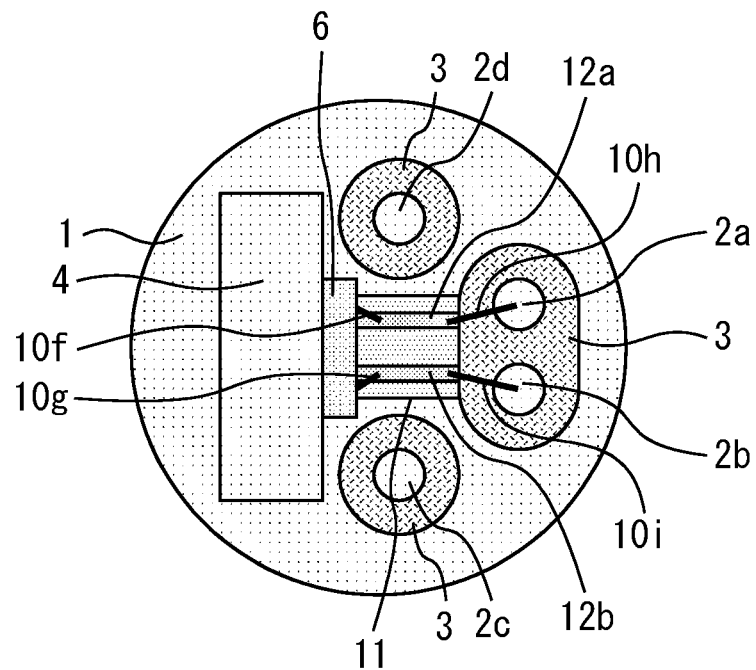
FIG. 5 is a top view illustrating the light receiving module according to Embodiment 1.

FIG. 5 is a top view illustrating the light receiving module according to Embodiment 1. The relay substrate 11 connecting the TIA 6 and each of the signal lead pins 2a and 2b is provided on the upper surface of the stem 1. The relay substrate 11 is arranged between the power-source lead pins 2c and 2d. This use of the relay substrate 11 increases the freedom of arrangement of the plurality of lead pins 2a to 2d, and the plurality of lead pins 2a to 2d can be arranged such that the radius of the stem 1 having a circular shape decreases. In addition, the use of the relay substrate 11 shortens the length of the wire between the TIA 6 and each of the signal lead pins 2a and 2b and decreases the inductance of the wire. As a result, the light receiving module that can prevent band degradation and achieve size reduction is obtained.

Figure 6:
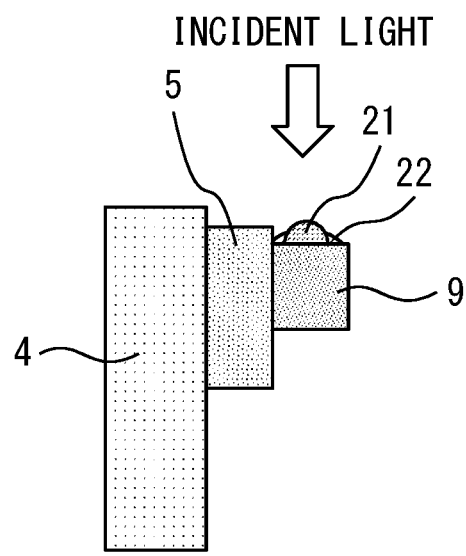
FIG. 6 is an enlarged side view illustrating a modification of the light receiving module according to Embodiment 1.
Figure 7:
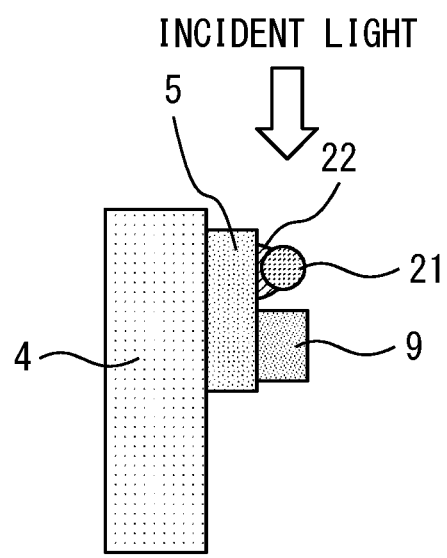
FIG. 7 is an enlarged side view illustrating a modification of the light receiving module according to Embodiment 1.

FIGS. 6 and 7 are enlarged side views illustrating modifications of the light receiving module according to Embodiment 1. In FIG. 6, a lens 21 is bonded to the end face of the waveguide light receiving device 9 by a bonding agent 22. In FIG. 7, the lens 21 is bonded to the sub mount 5 by the bonding agent 22 on a front side of the end face of the waveguide light receiving device 9. Accordingly, tolerance for optical coupling between the optical fiber 15 and the waveguide light receiving device 9 increases, and mounting position accuracy can be relaxed.

Embodiment 2

Figure 8:
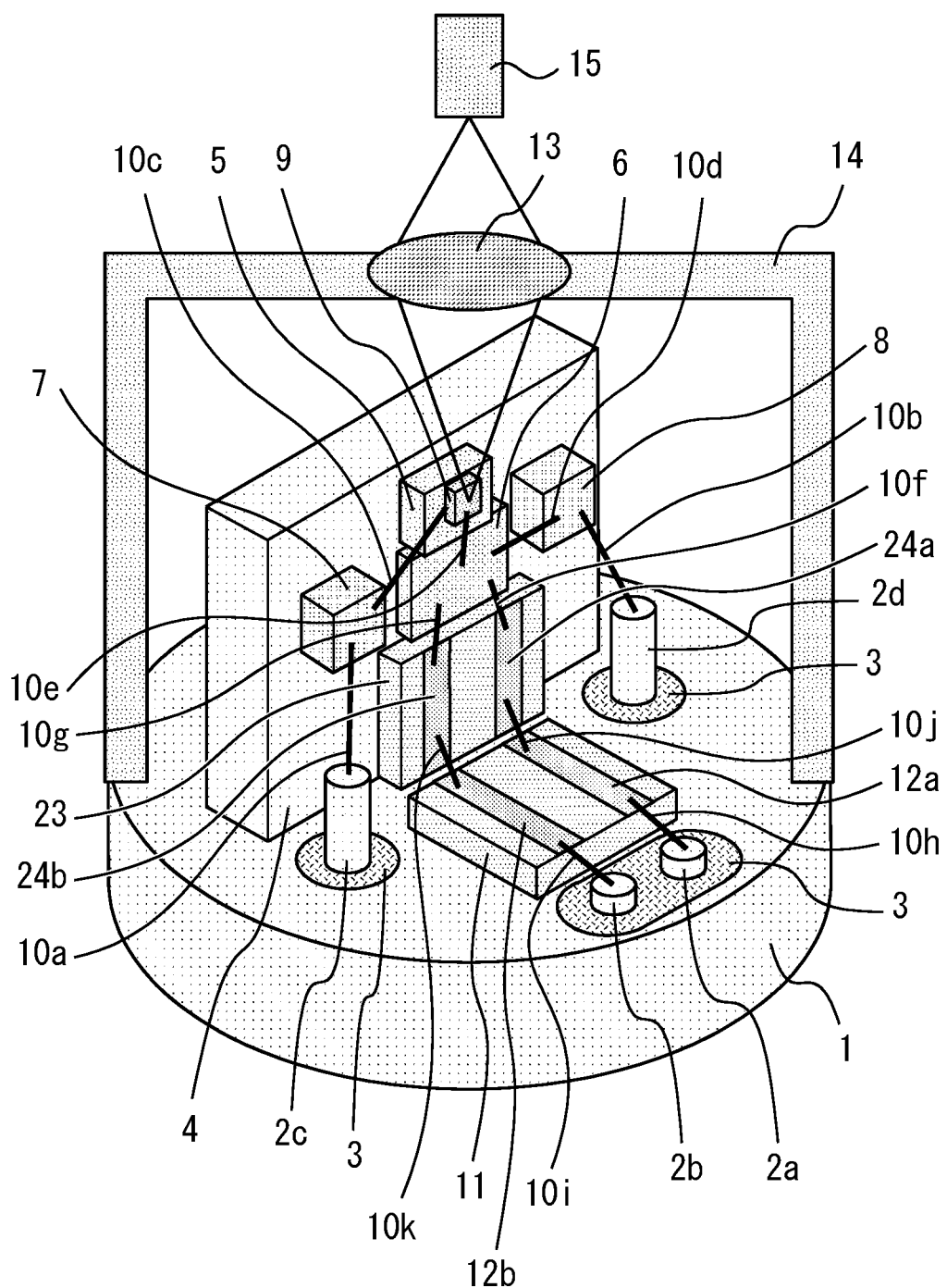
FIG. 8 is a perspective view illustrating a light receiving module according to Embodiment 2.

FIG. 8 is a perspective view illustrating a light receiving module according to Embodiment 2. A relay substrate 23 made of an insulator is provided on a side surface of the block 4. Transmission lines 24a and 24b are provided on the relay substrate 23. One end of the transmission line 24a is connected to the normal-phase output of the TIA 6 through the wire 10f. One end of the transmission line 24b is connected to the reverse-phase output of the TIA 6 through the wire 10g. The other ends of the transmission lines 24a and 24b are connected to the transmission lines 12a and 12b, respectively, through wires 10j and 10k. Note that the two relay substrates 11 and 23 may be integrated into a relay substrate having an L-shaped section.

When the height of the block 4 is increased to adjust the height of the waveguide light receiving device 9, the lengths of the wires 10f and 10g connecting the TIA 6 on the side surface of the block 4 to the transmission lines 12a and 12b of the relay substrate 11 on the upper surface of the stem 1 increase and the inductance of the wires increases in Embodiment 1. However, in the present embodiment, since the relay substrate 23 is additionally provided on the side surface of the block 4, the lengths of the wires 10f, 10g, 10j, and 10k can be shortened. Accordingly, it is possible to achieve inductance reduction and prevent band degradation.

Furthermore, in Embodiment 1, a space for capillary operation is necessary when the TIA 6 and the relay substrate 11 positioned on planes orthogonal to each other are connected through a wire, and accordingly, the length of the wire increases. However, in the present embodiment, there is a sufficient space for capillary operation when the TIA 6 and the relay substrate 23 on the same plane are connected through a wire, and accordingly, the length of the wire can be shortened. Other configurations and effects are the same as those in Embodiment 1.

Note that the transmission lines 24a and 24b may be connected to the transmission lines 12a and 12b by soldering. Accordingly, the total wire length can be shortened, thereby achieving further inductance reduction.

Embodiment 3

Figure 9:
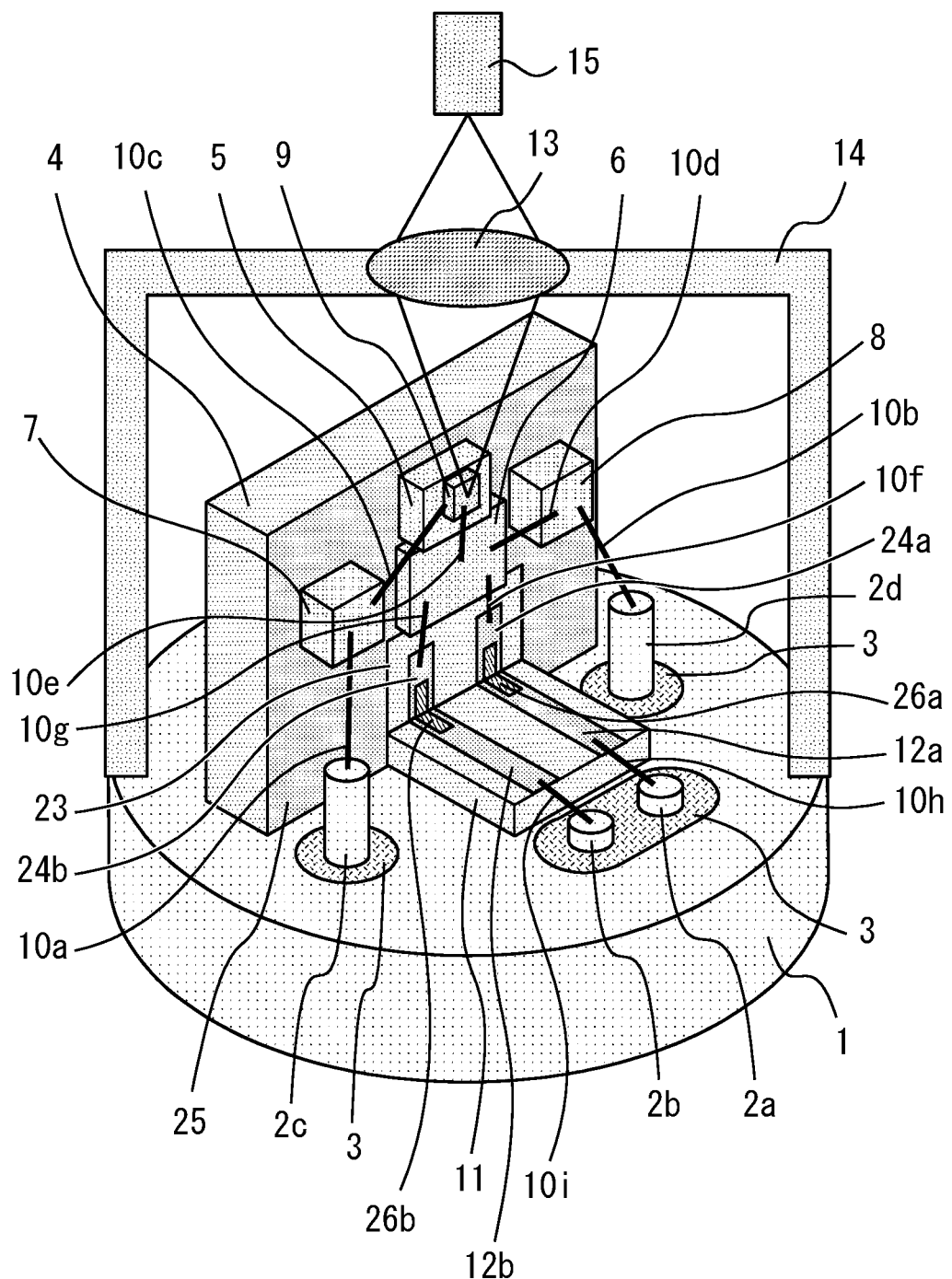
FIG. 9 is a perspective view illustrating a light receiving module according to Embodiment 3.

FIG. 9 is a perspective view illustrating a light receiving module according to Embodiment 3. In the present embodiment, the block 4 is made of an insulating material such as ceramic. A GND wiring pattern 25 and the transmission lines 24a and 24b are provided on a surface of the block 4. One end of each of the transmission lines 24a and 24b is connected to the corresponding one of the normal-phase and reverse-phase outputs of the TIA 6 through the corresponding one of the wires 10f and 10g. The other ends of the transmission lines 24a and 24b are joined to the transmission lines 12a and 12b by soldering 26a and 26b, respectively. Note that the transmission lines 24a and 24b may be connected to the transmission lines 12a and 12b through wires. In the present embodiment, since the transmission lines 24a and 24b are provided on the surface of the insulating block 4, the relay substrate 23 on the block 4 can be omitted. Other configurations and effects are the same as those in Embodiment 2.

REFERENCE SIGNS LIST 1 stem; 2a,2b lead pin (signal lead pin); 2c lead pin (first power-source lead pin); 2d lead pin (second power-source lead pin); 4 block; 5 sub mount; 9 waveguide light receiving device; 10f,10g wire (first wire); 10h,10i wire (second wire); 11 relay substrate (first relay substrate); 12a,12b transmission line (first transmission line); 21 lens; 23 relay substrate (second relay substrate); 24a,24b transmission line (second transmission line); 26a,26b soldering

The invention claimed is:
1. A light receiving module comprising:
a stem having a circular shape;
a plurality of lead pins penetrating through the stem and including a signal lead pin;
a block provided on an upper surface of the stem;
a waveguide light receiving device provided on a side surface of the block, the side surface of the block being substantially orthogonal to the upper surface of the stem;
an amplifier provided on the side surface of the block and amplifying an electric signal output from the waveguide light receiving device;
a first capacitor provided on the side surface of the block and connected to the waveguide light receiving device;
a second capacitor provided on the side surface of the block and connected to the amplifier;
a first relay substrate provided on the upper surface of the stem and arranged between the block and the signal lead pin;
a first transmission line provided on the first relay substrate;
a first wire connecting one end of the first transmission line and an output terminal of the amplifier; and
a second wire connecting the other end of the first transmission line and the signal lead pin,
wherein the plurality of lead pins includes a first power-source lead pin supplying electric power to the waveguide light receiving device and a second power-source lead pin supplying electric power to the amplifier,
the first relay substrate is arranged between the first power-source lead pin and the second power-source lead pin,
the first power-source lead pin is wire-connected to the first capacitor without the first relay substrate connected therebetween, and
the second power-source lead pin is wire-connected to the second capacitor without the first relay substrate connected therebetween.

2. The light receiving module according to claim 1, further comprising a second relay substrate provided on the side surface of the block, and a second transmission line provided on the second relay substrate,
wherein one end of the second transmission line is connected to the output terminal of the amplifier, and
the other end of the second transmission line is connected to the one end of the first transmission line.

3. The light receiving module according to claim 2, wherein the first and second relay substrates are integrated.

4. The light receiving module according to claim 1, further comprising a second transmission line provided on the side surface of the block,
wherein the block is made of an insulating material,
one end of the second transmission line is connected to the output terminal of the amplifier, and
the other end of the second transmission line is connected to the one end of the first transmission line.

5. The light receiving module according to claim 2, wherein the other end of the second transmission line is joined to the one end of the first transmission line by soldering.

6. The light receiving module according to claim 1, further comprising a lens bonded to an end face of the waveguide light receiving device.

7. The light receiving module according to claim 1, further comprising a sub mount provided on the side surface of the block and on which the waveguide light receiving device is mounted, and a lens bonded to the sub mount on a front side of an end face of the waveguide light receiving device.

* * * * *